United States Patent [19]

Erdi

[11] E Patent Number: Re. 33,475

[45] Reissued Date of Patent: Dec. 4, 1990

[54] INTEGRATED CIRCUIT HAVING PERMANENT ADJUSTMENT CIRCUITRY WHICH REQUIRES LOW ADJUSTMENT CURRENT

[75] Inventor: George Erdi, Portola Valley, Calif.

[73] Assignee: Linear Technology Corporation, Milpitas, Calif.

[21] Appl. No.: 368,842

[22] Filed: Jun. 20, 1989

Related U.S. Patent Documents

Reissue of:

[64] Patent No.: 4,775,884
Issued: Oct. 4, 1988
Appl. No.: 38,420
Filed: Apr. 14, 1987

U.S. Applications:

[63] Continuation of Ser. No. 637,513, Aug. 3, 1984, abandoned.

[51] Int. Cl.[5] ..... H01L 27/04; H01C 10/18

[52] U.S. Cl. ..... 357/51; 357/13; 338/92

[58] Field of Search ..... 323/354; 338/92, 95; 357/13, 51

[56] References Cited

U.S. PATENT DOCUMENTS 4,412,241 10/1983 Nelson ..... 357/13
4,451,839 5/1984 Nelson ..... 357/86

OTHER PUBLICATIONS

Lin, Integrated Electronics, Holden-Day, San Francisco, 1967, pp. 227-229.

*Primary Examiner*—William D. Larkins
*Attorney, Agent, or Firm*—Flehr, Hohbach, Test, Albritton & Herbert

[57] ABSTRACT

An integrated circuit resistor adjustment network with resistors (R1, $R_2$, $R_3$, $R_4$) which may be paralleled by trimming resistors (R5, R7, R6, R8, respectively) upon electrical "zapping" of Zener diodes (Z1, Z2, Z3, Z4, respectively) connected in series with the trimming resistors. The Zener diodes (Z1, Z4 or Z2, Z3) are connected in inverse series via inverse paralleled diodes (D1, D2 or D3, D4 respectively) which are non-conductive during normal operation, but conduct during higher voltage zapping operation to permit the currents for zapping the Zener diodes to bypass the resistors. By having the trimming resistors in two branches (R1, R5, R4, R6 and R2, R7, R3, R8 respectively) so arranged that in one branch a resistor of value 4R may be paralleled with a 1R resistor and an 8R resistor may be paralleled with a 2R resistor, and in the other branch, a 4R resistor may be paralleled with an 2R resistor and an 8R resistor may be paralleled with a 1R resistor, offsets can be trimmed in either direction in approximately equally spaced steps.

12 Claims, 4 Drawing Sheets

Figure 1:
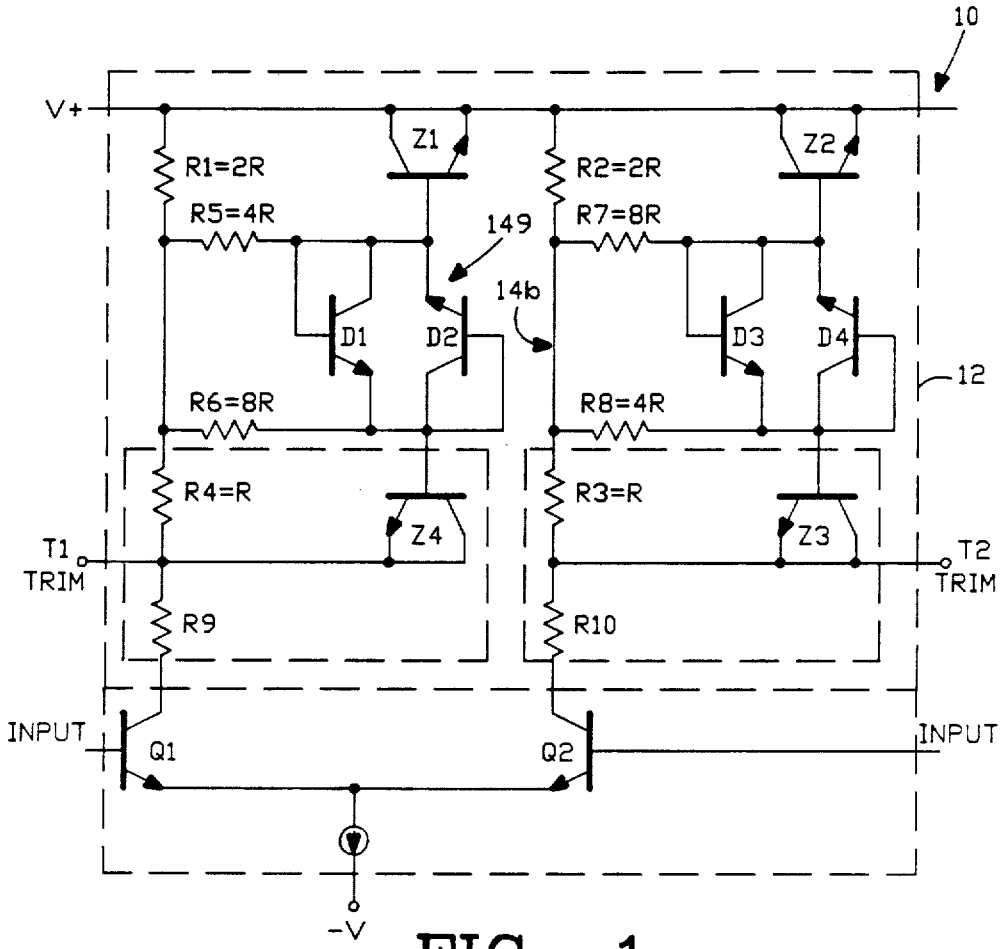

INTEGRATED CIRCUIT HAVING PERMANENT ADJUSTMENT CIRCUITRY WHICH REQUIRES LOW ADJUSTMENT CURRENT

Matter enclosed in heavy brackets [ ] appears in the original patent but forms no part of this reissue specification; matter printed in italics indicates the additions made by reissue.

This is a continuation of application Ser. No. 637,513 filed Aug. 3, 1984, now abandoned.

The present invention relates generally to integrated circuits, especially packaged integrated circuits, such as operational amplifiers, comparators, instrumentation amplifiers, sample and hold circuits, as well as other linear devices, and more particularly to a technique for making adjustments to these types of devices, both at wafer testing and after the devices have been packaged.

The permanent adjustment at wafer testing of linear integrated circuit parameters is a well-established procedure. By shorting out one or more predesigned zener diodes using any number of readily available terminals (commonly referred to as "Zener Zapping") and/or by carrying out other suitable techniques such as laser trimming, prepackaging adjustments can be made. However, during assembly, the integrated circuit undergoes slight changes due to the high temperatures and stresses introduced during and as a result of this packaging. This is especially true when plastic and hermetic dual inline packages are used. As a result, some of the advantages of wafer test trimming are negated and, because of the packaging, the prepackaging techniques are not available.

One typically used post-packaging technique which compensates for manufacturing errors including those resulting from the packaging process is to provide internal circuitry cooperating with external trim terminals. The end user connects these terminals to an external potentiometer to adjust a given parameter, for example input offset voltage, to zero or to its optimum value. While this approach is generally satisfactory, it can be inconvenient to the extent that the potentiometer must itself be adjusted if, for example, the integrated circuit it is connected to become defective, requiring a replacement. At the same time, it has been difficult heretofore to make any worthwhile permanent adjustments to the integrated circuit after packaging since only a limited number of terminals are available.

Other techniques for adjusting integrated circuits, both in the wafer testing period and after the circuits have been packaged, are described in U.S. Pat. Nos. 4,225,878 (Dobkin) and 4,412,241 (Nelson). Each of these patents uses what may be referred to as "back-to-back" pairs of zener diodes and zener zapping for selectively shorting out combination of these diodes in order to make the desired adjustments. For example, in the Dobkin patent, two pairs of back-to-back zener diodes are placed in parallel relationship with four resistors. Three pads (terminals) are connected with these diodes and resistors so that any one of the diodes can be zapped (permanently shorted out) by applying a suitable source of voltage (a pulse source), properly biased, across two of the pads. This causes current (trimming pulses) to flow in the reverse biased direction across one of the diodes of the back-to-back pair, e.g., the one to be zapped and in the forward biased direction across the other diode of the pair. In the Nelson patent, pairs of straight diodes are used to couple the zener diode pairs to their pads.

In the trimming techniques described in the Dobkin and Nelson patents, each requires a relatively large amount of current, for example on the order of an ampere, in order to zap their respective zener diodes. For the reasons to be discussed hereinafter, as well as other reasons, it is not always desirable to use such high currents in an integrated circuit environment generally or for trimming purposes in particular. For the moment, it suffices to say the excessive zapping currents could damage other components making up the integrated circuit or prevent zapping from occurring at all because of excessive lateral current flow in the substrate of the IC.

In view of the foregoing, it is an object of the present invention to provide an integrated circuit having permanent adjustment circuitry which uses a zener zapping technique with back to back zener diodes but which operates at relatively low zapping current, for example, on the order of eighty milliamperes, rather than the much higher currents required in the Dobkin and Nelson patents.

A more specific object of the present invention is to provide adjustment circuitry in an integrated circuit using a zener zapping technique which includes one or more transistors functioning as zener diodes and associated passive elements, typically resistors, formed within the circuit substrate such that all or substantially all of the zapping current flows into the emitter-base junction of the zener diode to be zapped.

Another specific object of the present invention to provide a packaged integrated circuit of the general type described above, that is, one which is ultimately packaged so as to encase at least certain circuit components while providing access to these components from outside the package by means of external terminals, and particularly an integrated circuit which can be permanently altered after packaging in an uncomplicated, versatile, and reliable way using the low current zener zapping technique recited above.

Still another specific object of the present invention is to provide particular post-packaging adjustment circuitry using a low current zener zapping technique including two pairs of zener diodes in a way which can provide a fourteen fold improvement in the parameter being adjusted.

As indicated above, the integrated circuit disclosed herein may be one which is ultimately packaged so as to encase at least certain circuit components while providing access to these components from outside the package by means of external terminals. The post-packaging adjustment circuitry forming part of this circuit uses zener zapping principles to provide a means of permanently adjusting a given parameter of this integrated circuit after the latter has been packaged and, preferably, before the integrated circuit reaches the ultimate user, e.g., at the manufacturer's test site. This is accomplished by applying zapping current to a selected one or more encased zener diodes from a specific one or more of its external terminals so as to permanently short out the selected diode or diodes in a way which provides the desired adjustment to the overall circuit.

In accordance with one aspect of the present invention, the adjustment circuitry just recited uses transistors as its zener diodes to be zapped. Each zener diode has its emitter and collectors connected together and each along with associated passive element or element, e.g. resistors, are physically formed in a common tub isolated from the other zener diodes and associated passive elements. This insures that all or substantially all of the current which is provided to zap a given zener diode passes through that diode's emitter-base junction (the shorting junction) with at most minimal current passing through its collector. In this way, it is not necessary to provide more zapping current than is necessary to physically and permanently short out the selected zener diode which is typically on the order of eighty milliamps as compared to an ampere as required in the Dobkin and Nelson patents. As a result of this low current zapping capability, the adjustment circuitry disclosed herein may be taken advantage of in a modified form at wafer testing also.

In an actual working embodiment of the present invention the packaged integrated circuit is one which includes two balanced inputs such as an operational amplifier, a comparator, and the like and the particular parameter to be adjusted is, for example, offset voltage. This particular circuit also includes typical trim terminals for use with an external potentiometer in the manner described above, and a terminal for supplying operating voltage to the circuit. The post-packaging adjustment circuitry includes a pair of back-to-back transistors (functioning as the zener diodes to be zapped) and associated resistors designed into each input side of the integrated circuit, each transistor having its emitter and collector tied together and formed in its own tub with an associated resistor or resistors. So long as these zener diodes remain operative (that is, function as zener diodes), the post-packaging adjustment circuitry remains balanced and does not alter in any way the given parameter in question. However, the post-packaging adjustment circuitry is designed such that either one of the zener diodes on each side of the integrated circuit can be permanently shorted out by applying relatively low level current pulses, for example, in the eighty milliampere range, through it from the voltage supply terminal to an associated trim terminal or from the trim terminal to the voltage supply terminal, depending on which zener diode is being shorted out.

In addition to the four zener diodes, the post-packaging adjustment circuitry includes a specific network of associated resistors which are incorporated into or eliminated from both sides of the integrated circuit depending upon which zener diodes are permanently shorted out. In a preferred embodiment of the present invention, these resistors are selected in combination with four zener diodes, so that as much as a fourteen fold improvement can be made in the given parameter being adjusted. At the same time, even if both zener diodes making up a back-to-back pair are shorted out, the adjustment circuitry is designed so that this does not short out the corresponding trim terminal to the positive voltage supply. As a result, the trim terminals can be subsequently used in the conventional manner by the end user.

In another actual working embodiment of the present invention at wafer test, the integrated circuit is one which includes two balanced inputs such as an operational amplifier, a comparator, and the like and the particular parameter to be adjusted is, for example, offset voltage. This particular circuit also includes test pads which can be contacted during wafer test. The wafer test adjustment circuitry includes multiple pairs of back-to-back transistors (functioning as the zener diodes to be zapped) and associated resistors designed into each input side of the integrated circuit, each transistor having its emitter and collector tied together and formed in its own tub with an associated resistor or resistors. So long as these zener diodes remain operative (that is, function as zener diodes), the adjustment circuitry remains balanced and does not alter in any way the given parameter in question. However, the adjustment circuitry is designed such that either one of the zener diodes on each side of the integrated circuit can be permanently shorted out by applying relatively low level current pulses, for example, in the eighty milliampere range through the test pads.

Other objects and features of the present invention will be described in more detail hereinafter in conjunction with the drawings wherein:

FIG. 1 schematically illustrates part of a packaged integrated circuit including post-packaging adjustment circuitry designed in accordance with the present invention; and FIGS. 2a–2d and 3a–3d schematically illustrate how the post-packaging circuitry of FIG. 1 functions to alter a given parameter of the overall integrated circuit shown in FIG. 1.

Figure 3:
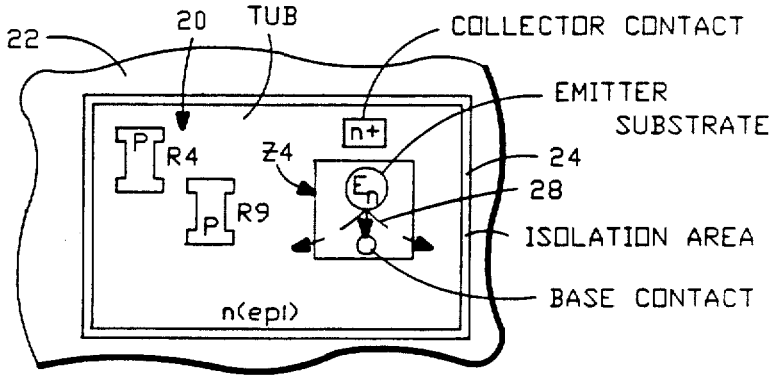

FIG. 3 shows a top view of an integrated circuit structure that may be used.

Figure 4:
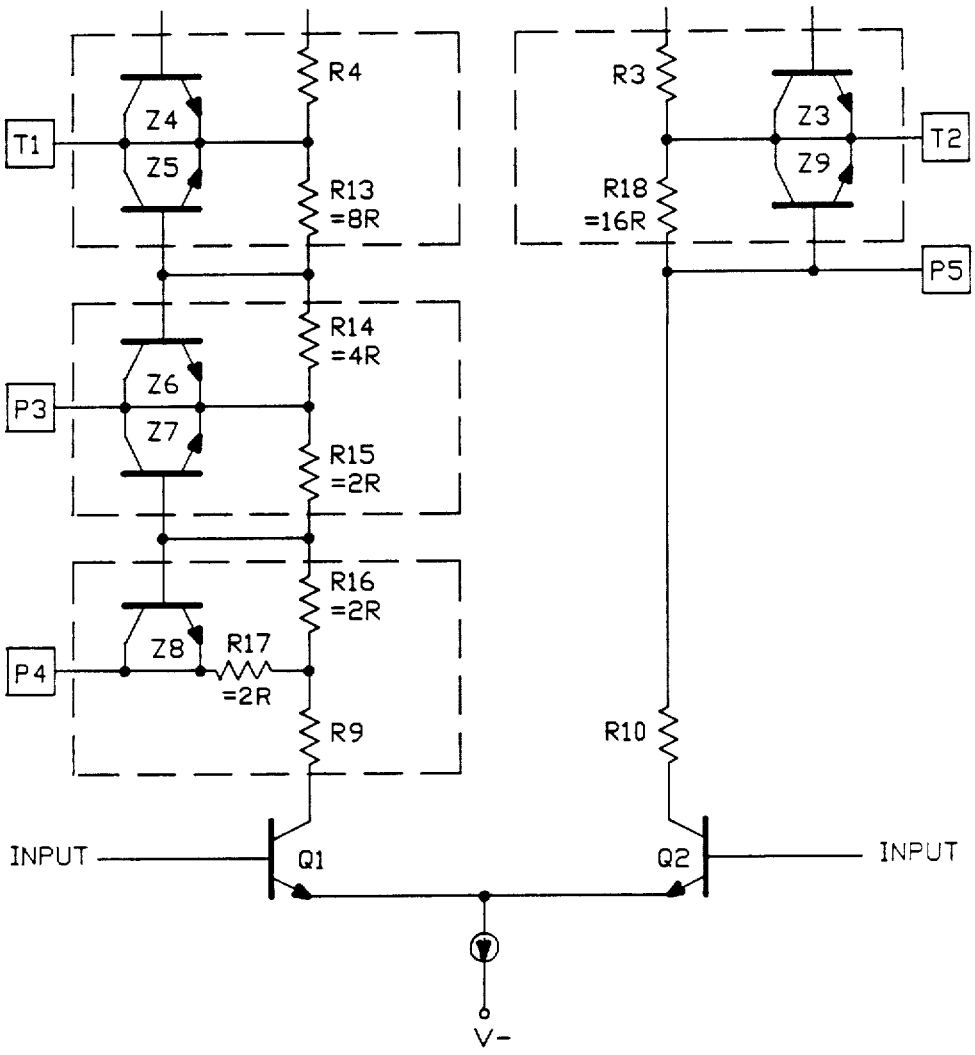

FIG. 4 schematically illustrates part of the integrated circuit including wafer test adjustment circuitry designed in accordance with the present invention.

Figure 5:
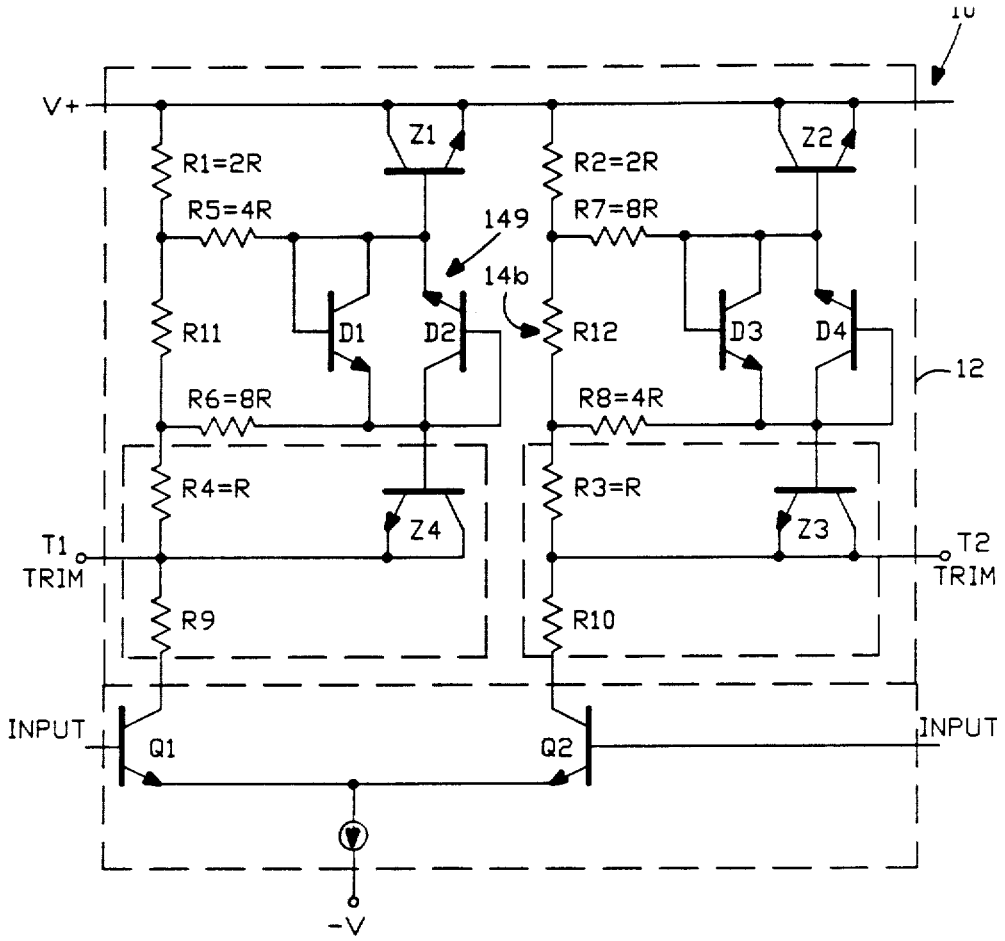

*FIG. 5 schematically illustrates part of a package integrated circuit including a means to increase the adjustment with an external potentiometer.*

Turning now to the drawings, attention is first directed to FIG. 1 which schematically illustrates part of an overall integrated circuit (IC) such as an operational amplifier, a comparator, an instrumentation amplifier, a sample and hold circuit, or the like, generally indicated by the reference numeral 10. This integral circuit is prepackaged, as indicated at 12, so as to encase its circuit components including, for example, the transistors Q1 and Q2 forming part of the input stage of the overall IC and post-packaging adjustment circuitry generally indicated at 14. With the exception of this circuitry, IC 10 functions in a known manner as an operational amplifier, comparator, or the like and, hence, includes a number of other circuit components which have not been illustrated.

Inasmuch as the overall integrated circuit 10, except for adjustment circuitry 14, functions in a known manner, it will not be described in detail. It suffices to say that when the IC is in its quiescent state, resistors and transistors on one side of the input differential stage of the integrated circuit are supposed to be in perfect balance with the corresponding resistors and transistors on the opposite side. Offset voltage is a measure of the mismatch between the two sides of the differential stage. As discussed above, during assembly of the integrated circuit, particularly in plastic and hermetic dual inline packages, the integrated circuit tends to undergo slight changes due to the high temperatures and stresses introduced during packaging. This, in turn, may cause the otherwise balanced parameters such as offset voltage to become imbalanced to a greater or lesser degree. As will be seen below, post-packaging adjustment circuit 14 corrects for such errors.

As illustrated in FIG. 1, post-packaging adjustment circuitry 14 includes two similar subcircuits 14a and 14b respectively electrically connected between external trim terminals T1, T2 and a common terminal $V^+$ for supplying operating voltage to the IC. The subcircuit 14a includes a pair of transistors Z1 and Z4, each of which has its emitter and collector tied together so as to function as a diode in the forward direction (forward biased) and as a zener diode in the reverse direction (reverse biased). Z1 and Z4 are connected in a back-to-back fashion between another pair of transistors D1 and D2, each of which has its base and collector tied together so as to function as a diode. These four components along with a network of resistors R1, R4, R5, and R6 interconnected in the manner illustrated make up subcircuit 14a between trim terminal T1 and voltage supply terminal V+. Subcircuit 14b is comprised of corresponding zener diodes Z2 and Z3, diodes D3 and D4 and the network of resistors R2, R3, R7, and R8 all of which are interconnected between trim terminal T2 and terminal V+. In addition to these subcircuits, adjustment circuitry 14 includes a resistor R9 between the subcircuit 14a and the collector of input transistor Q1 and a resistor R10 between subcircuit 14b and the collector of input transistor Q2.

For the reasons to become apparent hereinafter, the resistors R1–R8 have the resistance values indicated in FIG. 1 (relative to the resistance R). Also, each zener diode and diode when operating normally will not turn on (e.g., conduct current) unless a sufficiently large voltage, for example 400 millivolts or more, is applied across it. At the same time, the voltage drops across R1, R2, R3, R4, R11 and R12 are normally substantially lower than 400 mV. Thus, during normal operation of the IC, if all of the zener diodes and diodes are in operating order, they will remain off and the only resistors between terminal V+ and the trim terminals T1, T2 are resistors R1, R4, R11 and R2, R3, R12 respectively. Accordingly, under these conditions, the two subcircuits 14a and 14b are balanced (resistance-wise) between terminal V+ and the trim terminals at 3R on each side, and do not affect the balance, and hence the offset voltage of the overall IC. If the offset voltage is within the desired levels no changes in the subcircuits need be made. However if the offset voltage is larger than required, the subcircuits can be permanently modified in the manner to be described in order to change the resistance of the subcircuits in a way which will reduce the offset voltage as much as fourteen fold, as will be seen.

Figure 2A:
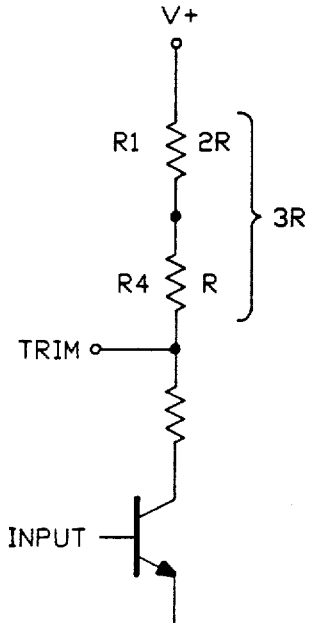
Figure 2B:
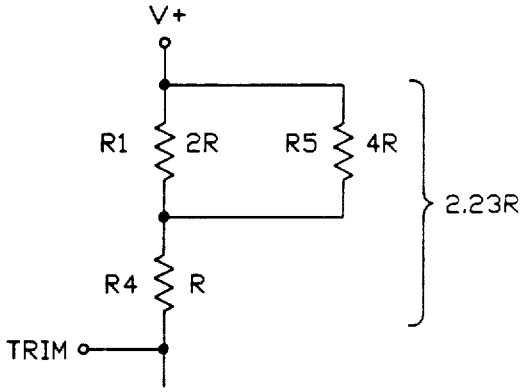
Figure 2C:
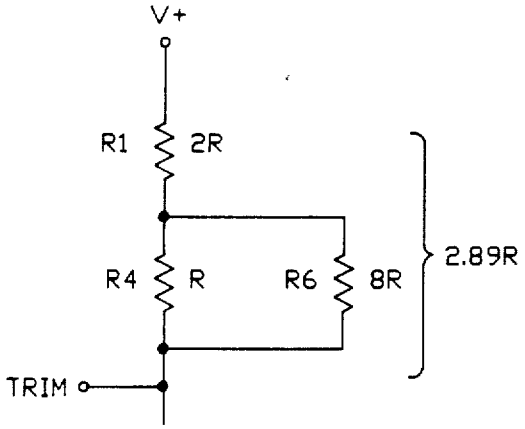
Figure 2D:
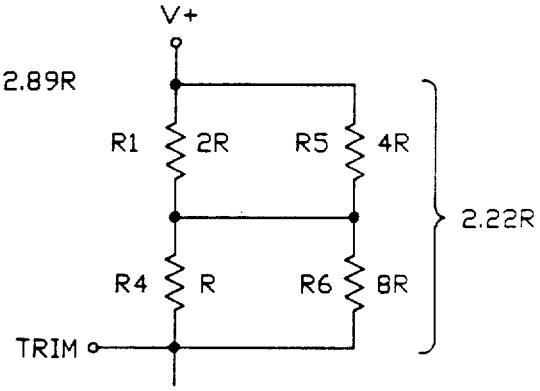

In order to understand how the subcircuits 14a and 14b of circuitry 14 are permanently modified to provide post-packaging adjustments to the overall integrated circuit, it is first necessary to understand how each subcircuit functions apart from the rest of the circuitry. Referring first to subcircuit 14a, as stated above, the zener diodes Z1 and Z4 and the diodes D1 and D2 present open circuits between trim terminal T1 and voltage supply terminal V+ so long as these components operate in the normal manner, that is, as zener diodes and diodes, respectively, and so long as the voltage drop across each of these components is not large enough to turn it on. In this case, as also stated above, the effective resistance between the two terminals is made up of the series connected resistors R1 and R4, which is best illustrated in FIG. 2a. If the zener diode Z1 is caused to conduct current, for example by being permanently shorted during normal operation of the overall IC 10 while the zener diode Z4 and the diodes D1, D2 remain off, the 'effective resistance' placed between trim terminal T1 and voltage supply terminal V+ will be formed from the series connection of resistor R4 and the parallel equivalent of R1 and R5, as illustrated in FIG. 2b. If only the zener diode Z4 is caused to conduct current, the effective resistance will be formed from the parallel equivalents of R4 and R6 in series with R1, as illustrated in FIG. 2c. If both of the zener diodes Z1 and Z4 are caused to conduct current, the effective resistance between the two terminals T1 and V+ is the series/parallel equivalent shown in FIG. 2d. The same type of resistance changes can be made between the trim terminal T2 and voltage supply terminal V+ using subcircuit 14b.

From the foregoing description of subcircuits 14a and 14b, it should be apparent that each functions as a variable resistor between its trim and voltage supply terminals. By providing the resistance values indicated in FIG. 1 for resistors R1–R8, the resistance difference between the two subcircuits is summarized in Table I for the various combinations of zener diodes shorted.

TABLE I

| Zener Diode Shorted | Resistance Difference (14A–14B) |
|---|---|
| Z1, Z4 | −0.78 R |
| Z1 | −0.67 R |
| Z1, Z3, Z4 | −0.58 R |
| Z1, Z3 | −0.47 R |
| Z1, Z2, Z4 | −0.38 R |
| Z1, Z2 | −0.27 R |
| Z1, Z2, Z3, Z4 | −0.18 R |
| Z4 | −0.11 R |
| Z1, Z2, Z3 | −0.07 R |
| No Short | 0. |
| Z3, Z4 | +0.09 R |
| Z3 | +0.20 R |
| Z2, Z4 | +0.29 R |
| Z2 | +0.40 R |
| Z2, Z3, Z4 | +0.49 R |
| Z2, Z3 | +0.60 R |

By shorting the appropriate combination of zener diodes the resistance difference between the two sides can be adjusted over the range from −0.835 R to +0.655 R down to ±0.055 R, a nearly fourteen fold improvement.

The 0.055 R value is achievable because adjacent adjustment ranges of Table I are separated by 0.11 R or less.

Offset voltage adjustment range ($\Delta V_{os}$) is related to the resistors adjustment range ($\Delta R$) by the following formula:

$$\Delta V_{es} = \frac{kT}{q} n\left(1 + \frac{\Delta R}{R9 + 3R}\right) = \frac{kT}{q} \frac{\Delta R}{R9 + 3R}$$

$$= 0.026\, v\left(\frac{\Delta R}{R9 + 3R}\right) R9 = R10$$

where k is Boltzmann's constant $= 8.62 \times 10^{-5}$ ev/°k q is the electronic charge $= 1.6 \times 10^{-19}$ coulombs T is absolute temperature in °k As a numerical example if R9 = R10 = 50 R then $V_{os}$ can be adjusted from $$\frac{-.835R}{53R}(0.026\, v) = -410\mu v$$

and

-continued $$\frac{0.655R}{53R}(0.026\ v) = +321\mu v$$

and all $V_{os}$'s between these values to $$\frac{\pm 0.055R}{53R}(0.026\ v) = \pm 27\mu v$$

As indicated above, resistors R9 and R10 form part of the overall post-packaging adjustment circuit 14 along with subcircuits 14a and 14b. They also form part of the input stage to the overall IC. As illustrated in FIG. 1, subcircuit 14a is in series with resistor R9 and subcircuit 14b is in series with resistor R10. For a balanced IC, these resistors R9 and R10 are equal and, in the actual working embodiment, they are relatively large compared to resistors R1–R8 as indicated in the example above (e.g. 50 R) in order to function in the desired way in IC 10. Thus, after overall IC 10 has been packaged, the resistance between the input transistor T1, T2 and the supply voltage terminal V+ can be permanently changed without regard to resistors R9 and R10 to alter a given parameter of the overall integrated circuit. This is accomplished by permanently shorting out any one or more of the zener diodes Z1–Z4. Any given zener diode is permanently shorted out by applying a sufficiently large current through its emitter-base junction (i.e., from its emitter to its base). In the case of zener diode Z1, the current is forced into terminal V+ with trim terminal T1 grounded. In the case of zener diode Z4, the current is forced into the trim terminal T1 with terminal V+ grounded. In the case of zener diode z2, the current is forced into the V+ terminal with trim terminal T2 grounded. Finally, in the case of zener diode Z3, the current is forced into the trim terminal T2 with terminal V+ grounded. In an actual working embodiment, one of the terminals is maintained at +30 volts in each case while the opposing terminal is grounded, resulting in a shorting voltage of 30 volts, with the voltage supply current limited to a specified current.

In a preferred embodiment of the present invention, it is desirable to keep the shorting or zapping current just described to a minimum. It has been found that as little as 80 milliamps of current passing from the emitter to the base of any of the zener diodes is sufficient to permanently short that zener diode out. At the same time, a current level of 80 milliamps is sufficiently low so as not to damage the diodes or the other zener diode in the subcircuit when this amount of current passes through these components in the right direction. For example, if the zener diode Z1 is to be shorted out, 80 milliamps of current passing through its emitter-base function from the V+ terminal will also tend to pass through the diode D1 and the zener diode z4 since these are turned on by the shorting voltage recited above, e.g. the 30 volts. If the shorting current is too large, it could inadvertently damage diode D1 and the zener diode Z4. Current in addition to the zapping current has to be provided to pass through resistors R1 and R5.

In order to insure that substantially all of the shorting current passing through a given zener diode to be shorted out does so across its emitter-base junction, the physical characteristics of the p and n type material making up the integrated circuit component must be taken into consideration. Specifically, the base (p type material) must be maintained at a lower voltage (reversed biased) relative to the component's emitter and collector (n type material) not just at the base contact but all around the base periphery. If, for example the collector is at a lower voltage than any part of the base (forward biased), some of the current which should pass through the emitter-base junction will be lost to the collector. If circuitry 14 were made of zener diodes Z1–Z4 only, all that would be necessary to insure against such losses would be to connect together the emitter and collector of each zener diode, as illustrated. This would insure that both are at a higher voltage than any part of the base upon application of the previously described shorting voltage. However, the actual working embodiment of circuitry 14, as shown in FIG. 1, does in fact include resistors R1–R10, each of which is formed from p-type material in the integrated circuit. This poses no problem with respect to resistors R1, R5 and R2, R7, since they cannot forward bias when the terminal V+ has a positive voltage (e.g. +30 volts) with respect to trim terminals T1, T2 (ground), that is, when the zener diodes Z1 and Z2 are being shorted out. However, when zener diodes Z3 and Z4 are being shorted out, the resistors R3, R10 and R4, R9 could become forward biased, if not purposely prevented from doing so, for example, when all resistors are in a common isolation area with the positive supply, as is the common practice. Should this happen, since the resistors R3, R10 are both connected to the emitter-collector junction of zener diode Z3 and the resistors R4, R9 are both connected to the emitter-collector junction of zener diode Z4, some of the shorting current could be lost through these resistors through the surrounding epi (n-type material) in the integrated circuit.

A way to prevent the resistors R3, R10 and R4, R9 from forward biasing when zener diodes Z3, Z4 are being shorted out is to isolate each of these zener diodes with its associated resistors R3, R10 and R4, R9, respectively, from the other components in IC 10. This is best exemplified in FIG. 3 for Z4 and the resistors R4, R9. Note that all three are in a common tub 20 on the IC's substrate generally indicated at 22, as defined by the circumferential isolation area 24. So long as the n-type material remains positive relative to the p-type material, all of the current being "pumped" into the emitter of Z4 will pass through that part of the emitter-base junction which is indicated by arrow 26 in FIG. 3. This concentrates the current in a small area, and thus requires relatively low current to short out Z4. If the zener diode's collector or the resistor's epi become negative relative to the base at any point around the base periphery, some of this current will flow away from arrow 16, as indicated by dotted arrows 28. The zener diode Z3 and its associated resistors R3, R8 can be isolated in the same way as the zener diode Z4 and its associated resistors. It is not necessary to isolate the zener diodes Z1 and Z2 and the resistors R1 and R2 since they cannot forward bias in the scheme illustrated, as stated above. While not absolutely necessary, it is desirable to isolate the diode D1 and resistor R5 in one tub; the diode D2 and resistor R6 in another tub; the diode D3 and resistor R7 in still another tub, and, finally, the diode D4 and resistor R8 in yet another tub. This insures that all of the components function in the intended way.

By isolating the various components making up post-packaging adjustment circuit 14 in the manner described above, it is possible to permanently short out any one of the zener diodes Z1–Z4 using a minimum amount of current, for example the 80 milliamps referred to, plus the current through the parallel resistors. Nevertheless, even this relatively low current level is sufficiently high to saturate the diodes which conduct during the shorting procedure and therefore turn on the parasitic vertical pnp transistor associated with each tub. If that happens, some of the excess current will laterally flow through the integrated circuit's substrate. According to the present invention, the substrate itself is maintained at a lower voltage level than either trim terminal or the voltage supply terminal. More specifically, if the trim terminal T1 is, for example, maintained at +30 volts while the voltage supply terminal V+ is grounded in order to short out the zener diode Z4, the contact to the substrate (the v− terminal is at a negative voltage, for example −10 volts. Any saturation current laterally flowing in the integrated circuit's substrate will not develop excessive voltage drop (more than 10 volts) with respect to the negative terminal which is indicated at V−. Therefore all epi-substrate junctions of the IC will be reverse-biased and latch-up conditions are avoided. This would be true regardless of which zener diode is being shorted out. In the discussion above R11 and R12 were assumed to be zero. However, other values for R11 and R12 are possible as long as the voltage drops across R11 and R12 do not exceed 400 mV, so as not to turn on diodes D1–D4. *Referring now to FIG. 5,* R11 should equal R12 for balance. The presence of R11 and R12 increases the adjustment range with an external potentiometer. For calculation purposes, in the equations above R11 is added to R9, R12 is added to R10.

As indicated above, any one or all of the zener diodes Z1–Z4 can be permanently shorted out, or a combination thereof, by utilizing three external terminals only, specifically the two trim terminals T1 and T2 and the voltage supply terminal V+ in the case of the specific integrated circuit illustrated. At the same time, this does not prevent the trim terminals from being used in the conventional way, even if all of the zener diodes are permanently shorted out since the trim terminals are never shorted to the voltage supply terminal. As a result, the present invention is especially suitable for use in a post-packaging adjustment procedure. Because four zener diodes can be permanently shorted out by means of three terminals only, an otherwise standard integrated circuit of the general type described above, that is, one having a pair of trim terminals and a voltage supply terminal can be designed with these four zener diodes in the manner illustrated in FIG. 1 along with the described resistor networks in order to provide as much as a fourteen fold improvement in the given parameter being adjusted. By valuing the various resistors making up these networks in the manner indicated, a truth table can be made and incorporated into a computer program to determine exactly which zener diode or combination of zener diodes Z1–Z4 must be shorted out to achieve a desired change in the parameter being adjusted.

While a post-packaging adjustment procedure has been described in conjunction with the present invention and particularly the low current zapping technique disclosed herein it is to be understood that this latter technique is also useful in making adjustment at wafer sort. In this case it would not be necessary to limit the circuitry to three terminals, e.g., two trim terminals and a voltage supply terminal.

The circuit of FIG. 4 functions in a similar manner to FIG. 1 modified for specific adjustment at wafer test. Multiple back to back diodes (Z5–Z9) and their associated resistors (R13–R18) are contacted by test pads T1, T2, P3, P4, P5. T1 and T2 can be the same trim terminals as in FIG. 1, thus only three additional test pads are required. In the specific example of FIG. 4, thirty two times improvement can be achieved by shorting an appropriate combination of Z5 through Z9.

The uniqueness of the innovation, however, lies in the way the emitter and collector of each transistor are tied together and formed in its own isolation tub with associated resistors, as illustrated by the dotted enclosures in FIG. 4, and previously discussed in conjunction with FIGS. 1 and 3. This connection ensures that all the zapping current will enter the emitter-base junction to be zapped and the resistor parallel with it.

The circuit of FIG. 4 can be generalized to use more (or less) back to back diodes. For example adding two more zeners, two resistors of 16R and 32R (and changing R18 to 64R) and one more contact pad, increases the theoretical improvement from thirty two times to one hundred twenty eight times. These back-to-back zener diodes operate in the same manner discussed above with respect to FIG. 1. However, because the circuit of FIG. 4 is at wafer test, when two back-to-back zener diodes are zapped their associated terminals are shorted together while in the post packaging circuit of FIG. 1, the trim terminals are not shorted out to the positive supply.

What is claimed:

1. A packaged integrated circuit including a substrate, circuit components including two zener diodes and four resistors supported by said substrate, each of said zener diodes having an anode terminal and a cathode terminal, packaging means cooperating with said substrate so as to encase said components and a plurality of terminals including a voltage supply terminal and a trim terminal located outside said packaging means but cooperating with said circuit components for providing electrical access thereto, the improvement comprising:

a post packaging adjustment subcircuit including said two zener diodes and said four resistors, the first of said four resistors being connected in series between said voltage supply terminal and a first node, a first one of said zener diodes being connected in series between said voltage supply terminal and a second node, a second of said four resistors being connected in series between said first node and said second node, a third of said four resistors being connected in series between said first node and said trim terminal, the other of said zener diodes being connected in series between said trim terminal and a third node, and the fourth resistor being connected in series between said third node and said first node, the terminal of said first zener diode which is connected to said voltage supply terminal being of the same polarity as that terminal of the other zener diode which is connected to said trim terminal, whereby the resistance of said subcircuit measured between said voltage supply terminal and said trim terminal can be set to one of four different values by passing a current between said voltage supply terminal and said trim terminal to electrically short-circuit one or both of said two zener diodes if adjustment is desired, said subcircuit also including an arrangement of diodes connected between said second and third nodes such that during the short-circuiting of one or both of said zener diodes a low resistance path is provided through the arrangement of diodes and said zener diodes between said voltage supply terminal and said trim terminal.

2. The improvement according to claim 1 wherein said first diode is a transistor having its base and collector connected with said second node and its emitter connected with said third node, and wherein said second diode is a transistor having its base and collector connected to said third node and its emitter connected to said second node.

3. The improvement according to claim 1 wherein the resistance of said first resistor is twice the resistance of said third resistor, wherein the resistance of said second resistor is four times the resistance of said third resistor, and wherein the resistance of said fourth resistor is eight times the resistance of said third resistor.

4. A packaged integrated circuit including a substrate, circuit components including two pairs of zener diodes and two sets of resistors with four resistors in each set supported by said substrate, each of said zener diodes having an anode terminal and a cathode terminal, packaging means cooperating with said substrate so as to encase said components and a plurality of terminals including a voltage supply terminal and two trim terminals located outside said packaging means but cooperating with said circuit components for providing electrical access thereto, the improvement comprising two post packaging adjustment subcircuits, each including:

a respective one pair of said zener diodes and a respective one set of said four resistors, the first of said four resistors of said one set being connected in series between said voltage supply terminal and a first node, a first one of said zener diodes of said one pair being connected in series between said voltage supply terminal and a second node, a second of said four resistors of said one set being connected in series between said first node and said second node, a third of said four resistors of said one set being connected in series between said first node and a respective one of said two trim terminals, the other of said zener diodes of said one pair being connected in series between said one trim terminal and a third node, and the fourth resistor of said one set being connected in series between said third node and said first node, the terminal of said first zener diode of said one pair which is connected to said voltage supply terminal being of the same polarity as that terminal of the other zener diode of said one pair which is connected to said one trim terminal, whereby the resistance of each subcircuit measured between said voltage supply terminal and its trim terminal can be set to one of four different values by passing a current between said voltage supply terminal and its trim terminal to electrically short-circuit one or both of the two zener diodes of each pair of zener diodes if adjustment is desired, each of said subcircuits also including an arrangement of diodes connected between its second and third nodes such that during the short-circuiting of one or both of said zener diodes a low resistance path is provided through the arrangement of diodes and said zener diodes between said voltage supply terminal and its trim terminal.

5. The improvement according to claim 4 wherein, in one of said two post-packaging adjustment subcircuits, the resistance of its first resistor is twice the resistance of its third resistor, the resistance of its second resistor is four times the resistance of its third resistor, and the resistance of its fourth resistor is eight times the resistance of its third resistor, and in the second set of two sub-circuits, the resistance of said first resistor is twice the resistance of said third resistor, a resistance of said second resistor is eight times the resistance of said third resistor, and the resistance of said fourth resistor is four times the resistance of said third resistor.

6. The improvement according to claim 5 wherein the first diode in each of said sub-circuits is a transistor having its base and collector connected with the second node of that sub-circuit and its emitter connected with a third node of that sub-circuit, and wherein the second diode in each of said sub-circuits is a transistor having its base and collector connected to the third node of that sub-circuit and its emitter connected to the second node of said sub-circuit.

*7. A packaged integrated circuit including a substrate, circuit components including two zener diodes and five resistors supported by said substrate, each of said zener diodes having an anode terminal and a cathode terminal, packaging means cooperating with said substrate so as to encase said components and a plurality of terminals including a voltage supply terminal and a trim terminal located outside said packaging means but cooperating with said circuit components for providing electrical access thereto, the improvement comprising:*

*a post packaging adjustment subcircuit including said two zener diodes and said five resistors, the first of said five resistors being connected in series between said voltage supply terminal and a first node, a first one of said zener diodes being connected in series between said voltage supply terminal and a second node, a second of said five resistors being connected in series between said first node and said second node, a third of said five resistors being connected in series between said first node and a third node, a fourth of said five resistors being connected in series between said third node and said trim terminal, the other of said zener diodes being connected in series between said trim terminal and a fourth node, and the fifth resistor being connected in series between said third node and said fourth node, the terminal of said first zener diode which is connected to said voltage supply terminal being of the same polarity as that terminal of the other zener diode which is connected to said trim terminal, whereby the resistance of said subcircuit measured between said voltage supply terminal and said trim terminal can be set to one of four different values by passing a current between said voltage supply terminal and said trim terminal to electrically short-circuit one or both of said two zener diodes if adjustment is desired, said subcircuit also including an arrangement of two diodes connected between said second and fourth nodes such that during the short-circuiting of one or both of said zener diodes a low resistance path is provided through the arrangement of diodes and said zener diodes between said voltage supply terminal and said trim terminal.*

*8. The improvement according to claim 7 wherein said first diode is a transistor having its base and collector connected with said second node and its emitter connected with said fourth node, and wherein said second diode is a transistor having its base and collector connected to said fourth node and its emitter connected to said second node.*

*9. The improvement according to claim 7 wherein the resistance of said first resistor is twice the resistance of said fourth resistor, wherein the resistance of said second resistor is four times the resistance of said fourth resistor, and*

*wherein the resistance of said fifth resistor is eight times the resistance of said fourth resistor.*

*10. A packaged integrated circuit including a substrate, circuit components including two pairs of zener diodes and two sets of resistors with five resistors in each set supported by said substrate, each of said zener diodes having an anode terminal and a cathode terminal, packaging means cooperating with said substrate so as to encase said components and a plurality of terminals including a voltage supply terminal and two trim terminals located outside said packaging means but cooperating with said circuit components for providing electrical access thereto, the improvement comprising two post packaging adjustment subcircuits, each including:*

*a respective one pair of said zener diodes and a respective one set of said five resistors, the first of said five resistors of said one set being connected in series between said voltage supply terminal and a first node, a first one of said zener diodes of said one pair being connected in series between said voltage supply terminal and a second node, a second of said five resistors of said one set being connected in series between said first node and said second node, a third of said five resistors of said one set being connected in series between said first node and a third node, a fourth of said five resistors of said one set being connected in series between said third node and a respective one of said two trim terminals, the other of said zener diodes of said one pair being connected in series between said one trim terminal and a fourth node, and the fifth resistor of said one set being connected in series between said third node and said fourth node, the terminal of said first zener diode of said one pair which is connected to said voltage supply terminal being the same polarity as that terminal of the other zener diode of said one pair which is connected to said one trim terminal, whereby the resistance of each subcircuit measured between said voltage supply terminal and its trim terminal can be set to one of four different values by passing a current between said voltage supply terminal and its trim terminal to electrically short-circuit one or both of the two zener diodes of each pair of zener diodes if adjustment is desired, each of said subcircuits also including an arrangement of diodes connected between its second and fourth nodes such that during the short-circuiting of one or both of said zener diodes a low resistance path is provided through the arrangement of diodes and said zener diodes between said voltage supply terminal and its trim terminal.*

*11. The improvement according to claim 10 wherein, in one of said two post-packaging adjustment subcircuits, the resistance of its first resistor is twice the resistance of its fourth resistor, the resistance of its second resistor is four times the resistance of its fourth resistor, and the resistance of its fifth resistor is eight times the resistance of its fourth resistor, and in the second set of two sub-circuits, the resistance of said first resistor is twice the resistance of said fourth resistor, a resistance of said second resistor is eight times the resistance of said fourth resistor, and the resistance of said fifth resistor is four times the resistance of said fourth resistor.*

*12. The improvement according to claim 10 wherein the first diode in each of said sub-circuits is a transistor having its base and collector connected with the second node of that sub-circuit and its emitter connected with a fourth node of that sub-circuit, and wherein the second diode in each of said sub-circuits is a transistor having its base and collector connected to the fourth node of that sub-circuit and its emitter connected to the second node of said sub-circuit.*

* * * * *